US010541040B2

(12) United States Patent
Seider et al.

(10) Patent No.: US 10,541,040 B2
(45) Date of Patent: Jan. 21, 2020

(54) CIRCUIT ASSEMBLY FOR TIME-DISCRETIZING AN ANALOG ELECTRICAL SIGNAL

(71) Applicant: OSRAM GmbH, Munich (DE)

(72) Inventors: Andreas Seider, Obertaufkirchen (DE); Johannes Jantsch, Neuried (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/800,976

(22) Filed: Nov. 1, 2017

(65) Prior Publication Data

US 2018/0122493 A1    May 3, 2018

(30) Foreign Application Priority Data

Nov. 3, 2016    (DE) .................... 20 2016 106 149 U

(51) Int. Cl.
*G11C 27/02*    (2006.01)
*H05B 37/02*    (2006.01)
(Continued)

(52) U.S. Cl.
CPC ............ *G11C 27/024* (2013.01); *G11C 27/02* (2013.01); *H05B 37/0227* (2013.01); *G01S 13/56* (2013.01); *H03M 1/124* (2013.01)

(58) Field of Classification Search
CPC ... B65H 2701/31; B65H 63/062; G01P 13/00; G01R 31/3689; G01R 31/42; G11C 27/02; G11C 27/024; G01S 13/56; H02J 7/0021; H02J 9/062; H03H 19/008; H03J 3/185; H03M 1/1215; H03M 1/124; H03M 1/145;
(Continued)

(56) References Cited

U.S. PATENT DOCUMENTS 4,899,132 A     2/1990 Stobbe et al.
2003/0065472 A1*   4/2003 Eckel ..................... H05B 37/02
                                                    702/130
(Continued)

FOREIGN PATENT DOCUMENTS

DE        2601213 A1    7/1977
DE        3713416 A1    11/1988
(Continued)

*Primary Examiner* — Renan Luque

(74) *Attorney, Agent, or Firm* — Fitch, Even, Tabin & Flannery LLP

(57) ABSTRACT

There is provided a circuit assembly for time-discretizing an analog electrical signal, including an input terminal supplying the analog electrical signal, an output terminal providing a time-discrete signal depending on the supplied analog electrical signal and a sample and hold circuit, which comprises a capacitor connected to the output terminal, an electronic switching unit connected between the input terminal and the output terminal and a control unit controlling the switching unit, wherein the switching unit provides an off-state due to an off-signal of the control unit and an on-state due to an on-signal of the control unit, wherein the switching unit provides an electrical resistance in the on-state, which cooperates with the capacitor and comprises a preset resistance value, such that the sample and hold circuit provides a low-pass with preset cut-off frequency. There is further provided a detection device and lighting device with such a circuit assembly.

14 Claims, 6 Drawing Sheets

(51) Int. Cl.
*H03M 1/12* (2006.01)
*G01S 13/56* (2006.01)

(58) Field of Classification Search
CPC ..... H03M 1/46; H04B 3/548; H04Q 2209/30; H04Q 9/00; H05B 37/0218; H05B 37/0227; Y02B 20/44; Y02B 20/46; Y02P 70/30
See application file for complete search history.

(56) References Cited

U.S. PATENT DOCUMENTS

| | | | | |
|---|---|---|---|---|
| 2006/0238174 | A1* | 10/2006 | Russell | H05B 33/0818 323/229 |
| 2008/0258650 | A1* | 10/2008 | Steiner | H05B 37/0254 315/291 |
| 2010/0219908 | A1* | 9/2010 | Tu | H03M 3/396 333/172 |
| 2011/0037628 | A1* | 2/2011 | Petrovic | H03M 1/1038 341/118 |
| 2013/0069542 | A1* | 3/2013 | Curasi | H05B 37/0218 315/155 |
| 2013/0169457 | A1* | 7/2013 | Helio | G04F 10/005 341/120 |
| 2013/0321053 | A1* | 12/2013 | Bogner | G11C 27/024 327/261 |
| 2015/0223309 | A1* | 8/2015 | Mohan | G05B 15/02 315/153 |
| 2016/0044756 | A1* | 2/2016 | Claessens | H05B 33/0842 315/294 |

FOREIGN PATENT DOCUMENTS

| | | |
|---|---|---|
| DE | 10104159 A1 | 8/2002 |
| DE | 202013100811 U1 | 6/2014 |

* cited by examiner

CIRCUIT ASSEMBLY FOR TIME-DISCRETIZING AN ANALOG ELECTRICAL SIGNAL

TECHNICAL FIELD

The invention relates to a circuit assembly for time-discretizing an analog electrical signal, including an input terminal for supplying the analog electrical signal, an output terminal for providing a time-discrete signal depending on the supplied analog electrical signal and a sample and hold circuit comprising a capacitor connected to the output terminal, an electronic switching unit connected between the input terminal and the output terminal and a control unit for controlling the switching unit, wherein the switching unit is formed to provide an off-state due to an off-signal of the control unit and an on-state due to an on-signal of the control unit. Moreover, the invention relates to a detection device with a sensor unit, which provides an analog electrical sensor signal at a sensor terminal, and a circuit assembly for time-discretizing the analog electrical sensor signal, for which purpose an input terminal of the circuit assembly is connected to the sensor terminal of the sensor unit, and the circuit assembly is formed to provide a time-discrete sensor signal at an output terminal of the circuit assembly depending on the analog electrical sensor signal. Finally, the invention also relates to a lighting device with an illuminant and a lighting control for controlling the illuminant.

BACKGROUND

Circuit assemblies, detection devices with such circuit assemblies as well as also lighting devices are comprehensively known in the prior art such that a separate printed evidence is not required hereto. Detection devices of the generic type are often used as motion sensors, which serve for controlling lighting devices among other things, namely with respect to their illumination function. A motion sensor is an electronic sensor unit, which is able to recognize motions of objects, in particular of living beings, preferably of persons, in its closer environment and to provide a corresponding sensor signal. For this purpose, the sensor unit can capture one or more different physical quantities. Additionally, it can for example also be provided that the sensor unit is formed to compare the respectively captured physical quantity to a comparative value and to output a corresponding sensor signal, which can already be a digital signal. However, the sensor unit is often formed to provide an analog sensor signal, which is associated with a current value of the respectively captured physical quantity. Usually, the sensor signal is an electrical signal. For further evaluating the sensor signal, therefore, a circuit assembly is usually connected to the sensor unit, which can for example be encompassed by a further evaluation unit or the like or also be connected to such an evaluation unit.

Usually, digital signal processing is provided by the evaluation unit, which can preferably also include signal transformations or the like among other things. For this reason, the circuit assembly usually includes the sample and hold circuit and a low-pass filter, which serves as an anti-aliasing filter, between its input terminal and its output terminal. The effect of aliasing is for example described in Nachrichtentechnik by Steinbruch, Rupprecht, volume II, Nachrichtenübertragung, $3^{rd}$ edition, Springer Verlag, 1982, as well as also in Entwurf and Realisierung digitaler Filter by Seyed Ali Azizi, $3^{rd}$ edition, Oldenbourg Verlag, 1987, as well as furthers.

In particular in lighting devices, the sensor unit is often constituted by a radar module. Due to legal requirements and/or requirements due to standardization, an energy consumption by the lighting device in a standby mode is limited. This means for the lighting device that if the lighting device is deactivated with respect to the light emission, the radar module is active to be able to ensure motion recognition for realizing the function of a motion sensor. Therein, a preset energy consumption must not be exceeded.

In order to achieve this, it is usual in the prior art to supply the radar module with electrical energy in clocked manner. However, additional measures are required hereto.

However, it proves obstructive therein that the analog electrical signal provided by the radar module has to be time-discretized by the evaluation unit for the later digital signal processing. The discretization is usually achieved by a sample and hold circuit, which results in a maximally possible upper limit of a signal frequency at the output of the radar module according to sampling rate. This maximum frequency of the analog electrical sensor signal of the radar module should be approximately half of the sampling rate. If this maximum frequency is exceeded by the analog electrical sensor signal, problems with respect to the digital signal processing can arise due to the sampling theorem as a result. For this reason, the above mentioned low-pass is usually provided, the cut-off frequency of which is usually chosen corresponding to half of the sampling rate, such that the above mentioned problems can be avoided.

However, the employment of the low-pass filter proves problematic if the detection device is supplied with electrical energy in clocked manner. The employment of the low-pass, as explained above, is opposed to the pulsed energy supply, in particular also because requirement with respect to a settling time and the cut-off frequency are not adaptable hereto.

Heretofore, it is provided that the clocked energy supply for the radar module is effected by switching on and off a supply voltage. Thereby, the operating duration of the radar module can be reduced to about 10%, whereupon the energy consumption can be correspondingly reduced by about 90%. The radar module generates a frequency-variable, sinusoidal analog electrical sensor signal, which is modulated on a direct current component. In order not to amplify the pulsed direct current component in a subsequent amplifier circuit and thereby cause overload, this signal is stored until the next pulse by a sample and hold circuit.

Even if the above mentioned approach has proved itself, thus, the possibilities of employment are limited and the effort is high.

Therefore, the invention is based on the object to provide an improved circuit assembly as well as an improved detection device and an improved lighting device.

SUMMARY

As the solution, the invention proposes a circuit assembly, a detection device as well as a lighting device according to the independent claims.

Further advantageous configurations are apparent based on features of the dependent claims.

With respect to a generic circuit assembly, it is in particular proposed that the switching unit is formed to provide an electrical resistance in the on-state, which cooperates with the capacitor and comprises a preset resistance value such that the sample and hold circuit provides a low-pass with a preset cut-off frequency.

With respect to a generic detection device, it is in particular proposed that the circuit assembly thereof is formed according to the invention.

With respect to a generic lighting device, it is in particular proposed that is comprises a detection device according to the invention, which is connected to the lighting control.

The invention is based on the realization to use the sample and hold circuit present anyway at the same time to provide a low-pass function. Therein, the invention uses the capacitor already present in the sample and hold circuit anyway, which is connected on the signal supply side via a series resistance. By this series connection of the electrical resistance with the capacitor of the sample and hold circuit, thus, a low-pass is provided, by means of which the desired low-pass function can be realized, to protect the following signal processing from undesired effects of the aliasing and to reduce or avoid them, respectively.

Therein, the invention exploits that the switching unit usually provides a very low on-resistance in the on-state, which is only downwards limited by physical characteristics of the switching unit. Such an on-resistance is usually a few Ohms, in particular less than 10 Ohms, in particular less than 0.1 Ohms, preferably less than 0.005 Ohms. In the sample and hold circuit of the prior art, namely, a change of the signal is to be largely avoided by the switching unit. For this reason, the on-resistance of the switching unit is to be as low as possible in the prior art.

The invention deviates from this basic idea of the prior art. Namely, the invention uses the switching unit such that it provides a considerably larger resistance than the on-resistance in the on-state. Therein, the resistance of the switching unit in the on-state is chosen such that a low-pass is provided in cooperation with the capacitor, which has a cut-off frequency depending on the resistance value of the provided electrical resistance. Thereby, it is possible to be able to adjust the desired low-pass function and cut-off frequency, respectively, by selection of the preset resistance value. Unlike the prior art, thus, a certain signal distortion during sampling is accepted in the invention to avoid or to reduce problems occurring in the later, in particular digital, signal processing for example with respect to aliasing or the like.

By the invention, it is achieved that high-frequency signal portions of the analog electrical sensor signal can be attenuated by the low-pass filter operated in "pulsed" manner, whereby undesired amplitudes for example due to the aliasing effect can be reduced in particular in signal back transformations, wherein only a low, acceptable attenuation of the useful signal has to be accepted.

Therein, a cut-off frequency of the low-pass formed hereby can be determined according to the following inequation:

Cut-off frequency≥1/(2π·resistance value·capacitance value of the capacitor)

In particular, the cut-off frequency is greater than about 1,000 Hz, preferably it is greater than about 3,000 Hz and particularly preferably it is about 3,500 Hz.

The switching unit is usually formed to allow a sampling rate of greater than about 1 kHz.

According to a configuration, it is proposed that the switching unit comprises a series connection of a switching element comprising a switching path with an electrical resistance. The electrical resistance can for example be an electronic component in this case. Preferably, the switching element is formed by a semiconductor switch. A semiconductor switch in terms of this disclosure is preferably a controllable electronic switching element, for example a transistor, combination circuits hereof, in particular a metal oxide semiconductor field effect transistor (MOSFET), analog circuitries like CMOS 4066 and/or the like.

The semiconductor switch as a switching element is presently operated in the switching operation. The switching operation of the semiconductor switch means that a very low electrical resistance is provided in the on-state between the terminals of the semiconductor switch forming a switching path, such that high current flow is possible with very small residual voltage. In the off-state, the switching path of the semiconductor switch is high-ohmic, that is it provides a very high electrical resistance such that even with high electrical voltage applied to the switching path, substantially no or only a very low, in particular negligible, current flow is present. A linear operation, in which an intermediate value adjustable in analog manner by means of a control electrode of the semiconductor switch is adjustable with respect to the electrical resistance of the switching path, differs herefrom.

Preferably, the electrical resistance is formed adjustable and is connected to the control unit for adjusting its resistance value. Thereby, it is possible to also change the cut-off frequency, for example to adapt it to a certain operating situation, by changing the resistance value, by means of the control unit. For this purpose, the electrical resistance can be formed by a transistor, the control electrode of which is connected to the control unit for providing the corresponding resistance value. Preferably, the electrical resistance is formed by a bipolar transistor, a field effect transistor, in particular a junction field effect transistor or the like, in this configuration, which is for example operated in the linear operation in the on-state.

Moreover, it is proposed that the control unit is formed to keep the resistance value constant during the switched on state of the switching element. This configuration considers that the resistance value of the electrical resistance, in particular if it is constituted by a semiconductor switch like the transistor, can vary depending on its electrical loading. The control unit can capture this change of the resistance value, for example by means of suitable sensors, and act on the electrical resistance by means of a suitable control signal such that the resistance value is substantially independent of loading.

Preferably, the switching element and the control unit are integrally formed. Thereby, a simply manageable assembly can be provided, for example in that the control unit and the switching element are disposed in a common housing or even on a common semiconductor chip, such that the assembly can be handled as a single component in a manufacturing procedure.

Furthermore, it is proposed that the electrical resistance and the switching element are integrated to a common component. This allows providing a switching unit, which is only formed by a single component. This configuration results in advantages in terms of manufacture as well as also with respect to the electromagnetic compatibility. Moreover, a further common integration with the control unit can of course also be provided.

According to a development, it is proposed that the switching unit comprises a semiconductor switch, the switching path of which provides the electrical resistance in the switched on state. At this place, thus, the semiconductor switch is not operated in the fully switched on state during the intended operation, in particular during the on-state, but in an intermediate state, which is to be attributed to the analog operation. Thus, the semiconductor switch is not operated in the switched on state in the above mentioned switching operation. In this context, the resistance can be adjusted by means of a control signal of the control unit just as in the previously described adjustable electrical resistance. Moreover, there is of course the possibility of also realizing the resistance value of the electrical resistance provided by the semiconductor switch circuitry-wise, for example by operating the semiconductor switch in a preset operating point.

Furthermore, it is proposed that the circuit assembly comprises a correcting unit, which is connected to the output terminal and which is formed to capture an initial state of charge of the capacitor upon switching on the switching unit and an actual state of charge upon switching off of the switching unit immediately following the switching on and to determine and output a set state of charge. It is possible by the correcting unit to compensate for possible deviations caused by the low-pass effect in the sample and hold function to improve the accuracy of the sample and hold function of the circuit assembly. For this purpose, it can be provided that the correcting unit separately considers the actual low-pass function, for example in that the correcting unit is formed by a digital signal processing unit, which can calculate a corresponding correcting function.

Moreover, it is proposed that the correcting unit is formed to determine the set state of charge considering a time constant formed by the capacitor and the electrical resistance. Thus, the correcting unit considers here in particular the low-pass effect, which is achieved due to the invention using the sample and hold circuit. Thereby, the overall function can be further improved.

Preferably, the correcting unit is encompassed by the control unit. Thereby, a separate unit as well as also separate components can be saved.

On the part of the detection device, it is in particular proposed that the sensor unit includes a radar sensor, an ultrasonic sensor and/or an infrared sensor. These sensor units can of course also be combined with each other in nearly arbitrary manner to improve the sensor function. Therein, it can be provided that a common sensor signal is output with multiple sensor units. However, it can moreover also be provided that the sensor units, in particular each of the sensor units, output an own sensor signal, which is then supplied to the circuit assembly and, for example separately, processed.

Further, it is proposed that the detection device comprises a switchable electrical energy supply unit for supplying the detection device with electrical energy. The energy supply unit can be correspondingly switched on and off for this purpose. Thereby, an energy consumption of the detection device can be reduced.

Preferably, the energy supply unit is formed to supply at least the sensor unit with electrical energy in clocked manner. The sensor unit and the circuit assembly are the units, which are to be active for example with a switched off lighting device, namely to be able to adequately control the activation of the lighting function by the lighting device. Additionally, it can also be provided that at least the circuit assembly is also supplied with electrical energy in clocked manner. In order that the sensor unit and for example also the circuit assembly do not result in an undesirably high energy consumption with deactivated lighting function, they can be supplied with electrical energy in clocked manner by the energy supply unit. The clocked energy supply can for example be effected in that the energy supply is activated for some few seconds and is thereafter deactivated for also some seconds or even one or more minutes. Thereby, energy can be saved, but wherein a reliable sensor function can still be ensured at the same time.

Further, it is proposed that the sensor terminal is connected to the input terminal via a DC block capacitor. By the DC block capacitor, it can be ensured that the input terminal is not applied with a DC voltage in undesired manner and thus disturbs the following sample and hold function and/or that a DC voltage reacts upon the sensor unit on the part of the sample and hold function.

Preferably, an electrical resistance and a capacitor of the sample and hold circuit of the circuit assembly are dimensioned such that a cut-off frequency determined hereby is less than a clock frequency due to clocking of the energy supply by the energy supply unit. Thereby, the reliability of the function in particular with respect to the energy supply can be further improved.

Further, it is proposed that the detection device comprises an amplifier circuit connected to the output terminal for connecting a lighting control of a lighting device. Thereby, the detection device can be formed for connection to the lighting control such that a reliable function of the detection device can be achieved in connection with the lighting control. For this purpose, the amplifier circuit is as high-ohmic as possible on the input side such that it in particular does not load the sample and hold circuit and thereby does not result in a change of a respective sample value. At the same time, it is very low-ohmic on the output side such that a reliable signal transmission from the detection device to the lighting control is possible.

The advantages, features and effects specified for the circuit assembly of the invention of course also equally apply to the detection device equipped with the circuit assembly as well as to the lighting device equipped with the detection device.

BRIEF DESCRIPTION OF THE DRAWINGS

Further advantages, features and possibilities of configuration are apparent based on the following description of embodiments with reference to the attached figures. In the figures, identical reference characters denote identical features and functions.

DESCRIPTION OF THE PREFERRED EMBODIMENTS

Figure 1:
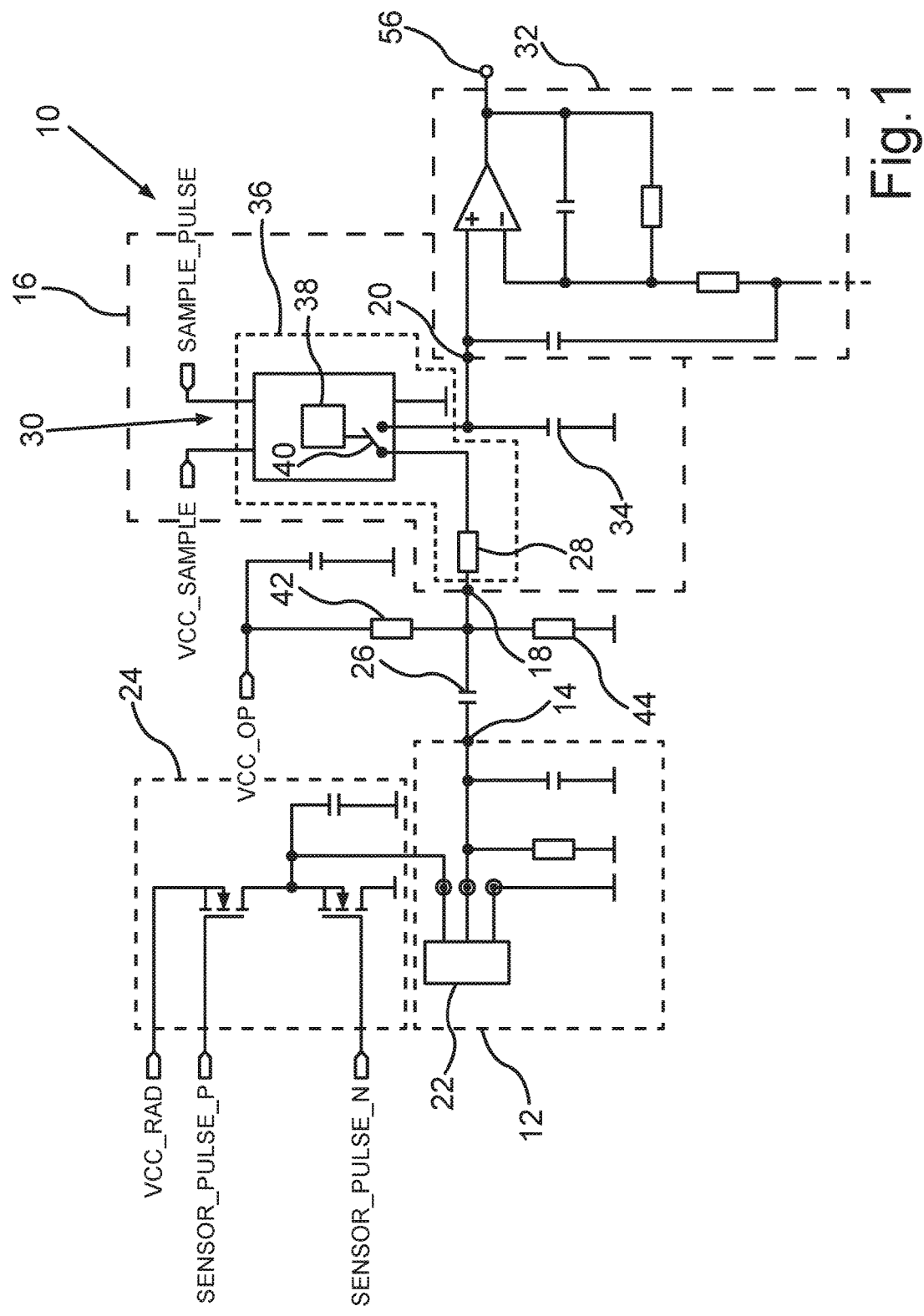
FIG. 1 is a schematic circuit diagram for a detection device with a radar module as the sensor unit and a circuit assembly according to the invention.

FIG. 1 shows a detection device 10 in the manner of a motion sensor with a sensor unit, which is presently formed by a radar module 12, in a schematic circuit diagram representation. The radar module 12 comprises a sensor terminal 14, at which an analog electrical sensor signal is provided.

The detection device 10 further includes a circuit assembly 16 for time-discretizing the analog electrical sensor signal. For this purpose, an input terminal 18 of the circuit assembly 16 is connected to the sensor terminal 14 of the radar module 12. The circuit assembly 16 is further formed to provide a time-discrete sensor signal at an output terminal 20 of the circuit assembly 16 depending on the analog electrical sensor signal.

Presently, the input terminal 18 is not immediately electrically coupled to the sensor terminal 14, but the connection is effected via a DC block capacitor 26, which causes a DC voltage separation between the radar module 12 and the circuit assembly 16. By means of two electrical resistances 42, 44, the input terminal 18 is applied with a preset electrical potential, which serves for adjusting an operating point of the circuit assembly 16.

The circuit assembly 16 serves for time-discretizing the analog electrical signal, which is applied to the input terminal 18. For this purpose, the circuit assembly 16 includes the output terminal 20 for providing the time-discrete signal depending on the supplied analog electrical signal and a sample and hold circuit 30 besides the input terminal 18 for supplying the analog electrical signal. The sample and hold circuit 30 comprises a capacitor 34 connected to the output terminal 20, an electronic switching unit 36 connected between the input terminal 18 and the output terminal 20 and a control unit 38 for controlling the switching unit 36. The switching unit 36 is formed to provide an off-state due to an off-signal of the control unit 38 and an on-state due to an on-signal of the control unit 38.

The switching unit 36 is formed to provide an electrical resistance 28 in the on-state, which cooperates with the capacitor 34 and comprises a preset resistance value, whereby the sample and hold circuit 30 provides a low-pass with a cut-off frequency depending on the resistance value.

For this purpose, it is presently provided that the switching unit 36 comprises a series connection of a switching element 40 comprising a switching path with an electrical resistance 28. Presently, the switching element 40 is formed by a semiconductor switch, which is formed as a field effect transistor. Presently, the field effect transistor is a metal oxide semiconductor field effect transistor (MOSFET), the switching path of which is formed between a source terminal and a drain terminal and which can be controlled with respect to the respective switching state by means of the on-signal and the off-signal at a gate terminal. Presently, the MOSFET 40 is operated in the switching operation. For this reason, a value of the electrical resistance between the input terminal 18 and the capacitor 34 or the output terminal 20 is substantially determined by the electrical resistance 28 in the on-state, which has a considerably greater electrical resistance value than the MOSFET 40 in the switched on state. In the off-state, in contrast, a resistance value of the MOSFET 40 is high such that current flow between the input terminal 18 and the capacitor 34 or the output terminal 20 is substantially prevented.

Presently, it is provided that the MOSFET 40 and the control unit 38 are integrally formed and integrated in a common housing. Thereby, a common component is formed. By the electrical resistance 28, which is connected in series with the MOSFET 40, cooperation with the capacitor 34 is achieved in the on-state, such that a low-pass function is realized by the sample and hold circuit 30. Thereby, the usual low-pass filter preceding in the prior art, also called anti-aliasing filter, can be omitted without having to accept the disadvantages caused hereby. By the invention, that is in that the electrical resistance 28 is provided, a realization of the low-pass function can be achieved integrally with the sample and hold circuit 30.

To the output terminal 20, an amplifier circuit 32 is connected, which amplifies the time-discrete sensor signal provided by the circuit assembly 16 and supplies it to further processing by a non-illustrated evaluation unit. The non-illustrated evaluation unit in particular performs a digital signal processing, which presently includes a discrete Fourier transformation as well as an inverse discrete Fourier transformation among other things. Namely, if low-pass filtering would not be available in sampling the analog signal in such a signal processing, this would result in not insignificant disturbances such that an evaluation signal of the evaluation circuit could be unusable.

From FIG. 1, it is further apparent that the radar module 12 comprises a radar sensor 22. In FIG. 1, it is represented by an integrated circuit, which is only connected by three terminals in the radar module 12 to the circuit thereof.

From FIG. 1, it is further apparent that an energy supply unit 24 is provided, which supplies the radar module 12 with electrical energy in clocked manner.

The non-shown evaluation signal of the evaluation unit serves to control a lighting control for an also non-illustrated lighting device. Thereby, the lighting device can be activated depending on a captured motion and can again be deactivated upon non-capturing a motion, respectively.

Based on the schematic diagrams or signal progressions according to FIGS. 2 to 5 as well as 7 to 15, the effect of the circuit assembly 16 is to be further explained in the following.

Figure 2:
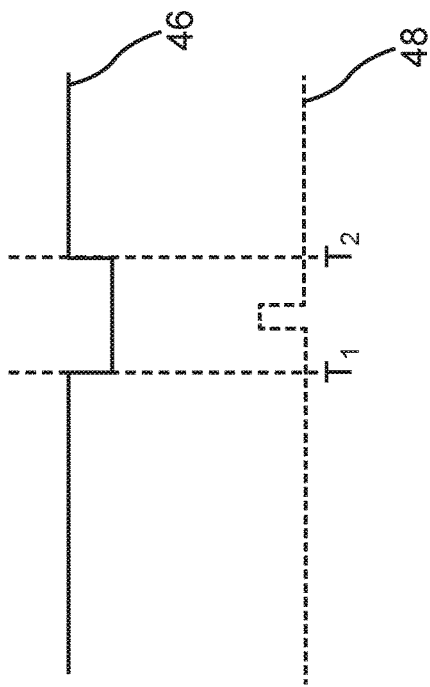
FIG. 2 shows in schematic representation a voltage-time diagram, by which a typical signal progression of a sensor signal of the radar sensor is represented.

FIG. 2 shows a typical signal progression for the sensor signal as an analog electrical signal of the radar module 12 in a schematic signal diagram, which is provided at the sensor terminal 14. FIG. 2 shows a corresponding signal progression by means of a graph 50.

Figure 3:
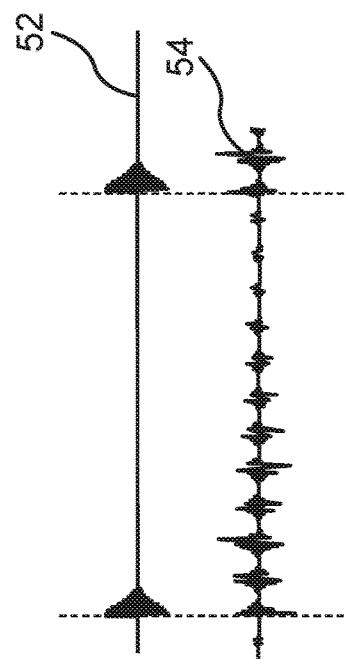
FIG. 3 is a further schematic signal diagram, which represents a supply voltage pulse for the purpose of energy supply of the detection device by means of a first graph and a sampling pulse by means of a second graph.

FIG. 3 shows a temporal progression of the clocked energy supply in an also schematic signal diagram by a first graph 46. It is apparent that the energy supply for the radar module 12 is activated at a point of time $T_1$ and again deactivated at a point of time $T_2$. From FIG. 3, it is further apparent by means of a second graph 48 that a sampling pulse is provided within the activated period of time of the radar module 12.

Figure 4:
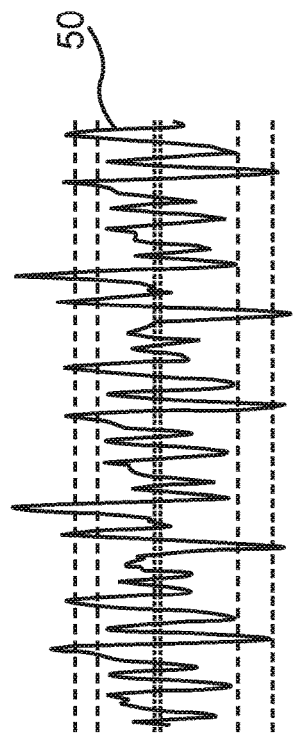
FIG. 4 is a schematic signal diagram, in which a test input signal is represented by a first graph and an amplifier output signal is represented by a second graph, wherein a low-pass is not present.

FIG. 4 shows a frequency-variable test input signal with a frequency range from 1 Hz to 30 kHz, in a schematic signal representation, which is represented by means of a graph 52. This input signal is present at the input terminal 18. By means of a graph 54, an amplifier output signal at the output terminal 56 of the amplifier 32 is represented. The amplifier output signal 54 presently results without low-pass effect. A plurality of substantially non-attenuated oscillation packets is present in the amplifier output signal 54 between two signal bursts of the test input signal 52.

Figure 5:
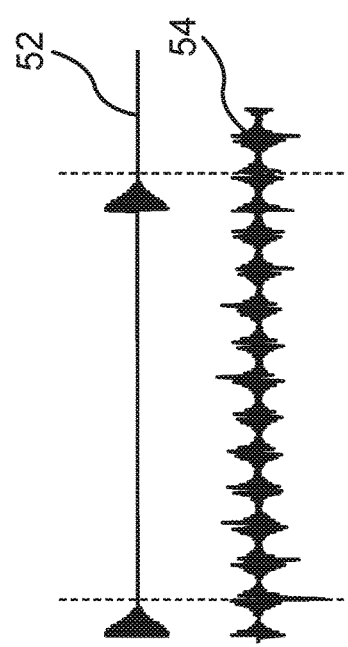
FIG. 5 is a diagram like FIG. 4, wherein a low-pass is here present.

FIG. 5 shows a representation as FIG. 4, but wherein now a low-pass effect is activated. It is apparent that the amplifier output signal 54 represents a signal progression, which is attenuated between two signal bursts of the test input signal 52. The low-pass effect is apparent herefrom.

Figure 6:
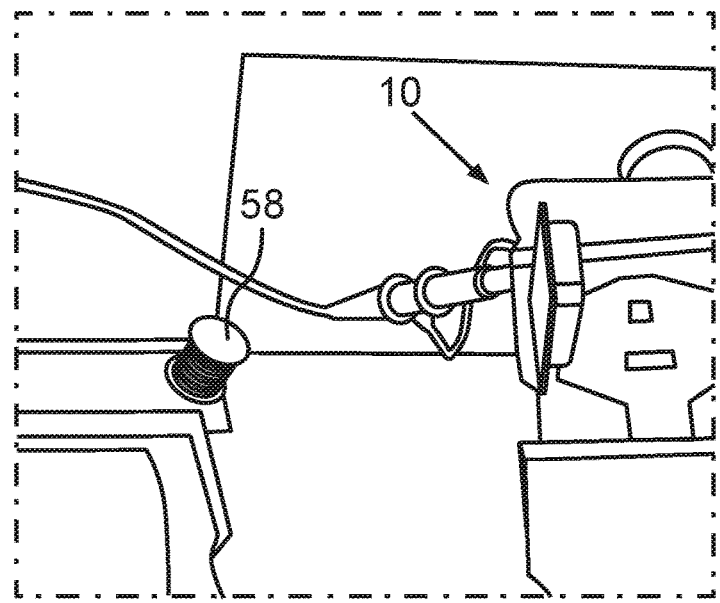
FIG. 6 is a schematic representation for a laboratory setup for performing measurements on a circuit assembly according to the invention.

FIG. 6 shows a schematic measurement setup for the detection device 10 according to FIG. 1. For the following explanations based on FIGS. 7 to 15, a coil 58 was placed in a capturing range of the radar module 12 of the detection device 10 and applied with a sinusoidal voltage with variable frequency. Presently, the radar module 12 is formed for a frequency in the range of about 24 GHz.

Figure 7:
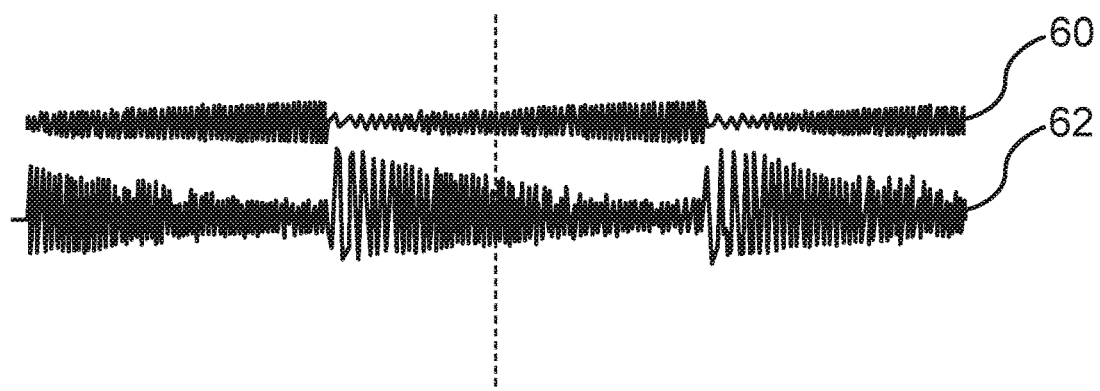
FIG. 7 is a schematic signal diagram, which represents a behavior of the circuit assembly according to FIG. 6 without low-pass effect.

In the following diagrams of FIGS. 7 to 15, the frequency signal, with which the coil 58 is applied, is represented by a graph 60. A corresponding output signal of the amplifier circuit 32 is represented by a graph 62. FIG. 7 shows the behavior of the output signal 62 upon application of the coil 58 with a frequency in the range from 100 Hz to 1 kHz in a schematic signal representation, wherein a low-pass function is not provided. Herein, it is apparent that the amplifier circuit 32 itself provides a low-pass effect.

If half of the sampling frequency of presently about 2.56 kHz, that is ca. 1.3 kHz, is exceeded, thus, deconvolution occurs according to the sampling theorem. Thereby, the high-frequency input signal is present in the output signal as smaller frequency component and a subsequent low-pass filter can no longer filter out this signal.

Figure 8:
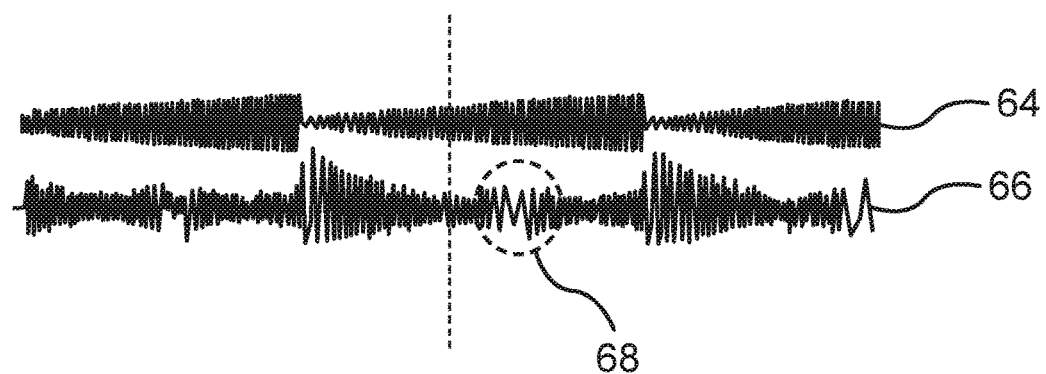
FIG. 8 is a representation like FIG. 7, wherein an input frequency is varied in a preset frequency range.

FIG. 8 also shows a schematic signal diagram, wherein here the application of the coil 58 with a frequency signal is illustrated by means of a graph 64. Presently, the coil 58 is applied with a frequency of 100 Hz to 2 kHz, wherein the application is effected according to a "sweep". The associated output signal is visible by a graph 66 in FIG. 8. It is apparent that disturbances due to the deconvolutions occur in the output signal 66 as it is for example apparent in the area identified by the reference character 68.

Figure 9:
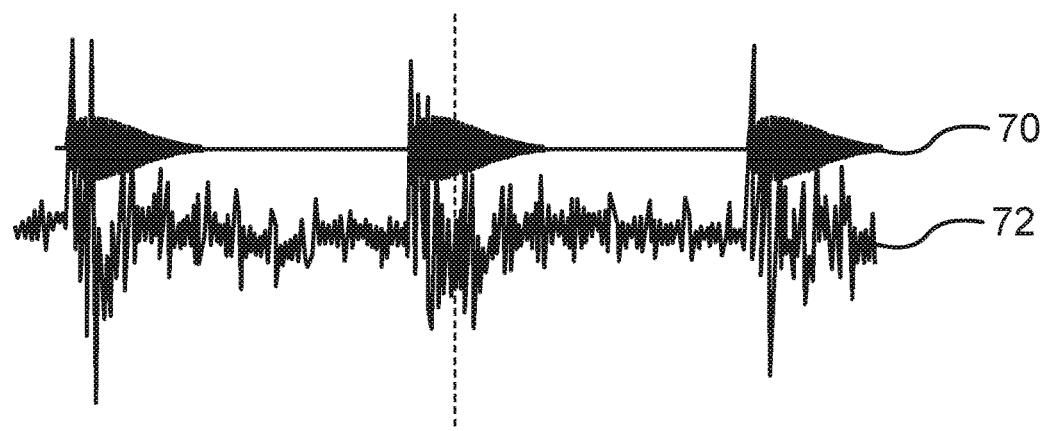
FIG. 9 is a representation like FIG. 8, wherein the frequency range is here larger than in the configuration according to FIG. 8.

If the frequency range is now increased to a range from 1 kHz to 25 kHz, thus, it is apparent according to the schematic signal diagram in FIG. 9 that deconvolutions periodically occur. By a graph 70, the test input signal is again represented in FIG. 9, whereas the output signal is represented by the graph 72. From FIG. 9, it is apparent, that in the output signal 72, which is analyzed in frequency by the evaluation circuit, it can no longer be differentiated between the original and a deconvoluted spectrum. Here, it is particularly clearly apparent how lack of low-pass effect affects the signal processing.

Now, if one pursues an approach, in which the output signal of the radar module 12 is treated by means of a low-pass still before the circuit assembly 16 to filter out the higher frequencies, thus, a corresponding low-pass filter with a cut-off frequency of about 1 kHz can be employed. For this purpose, a resistance value of the electrical resistance 28 can be chosen at 15 Ohms and a capacity of the low-pass can be chosen at 10 μF.

Figure 10:
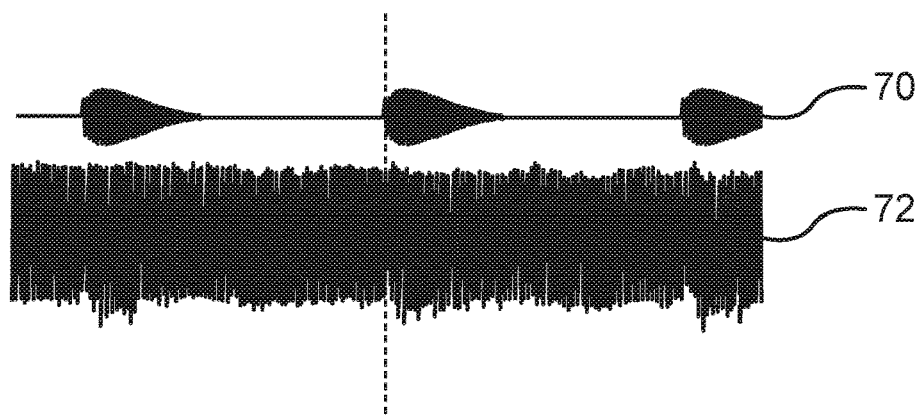
FIG. 10 is a schematic signal diagram of a signal representation of the output signal for an input signal according to FIG. 7.
Figure 11:
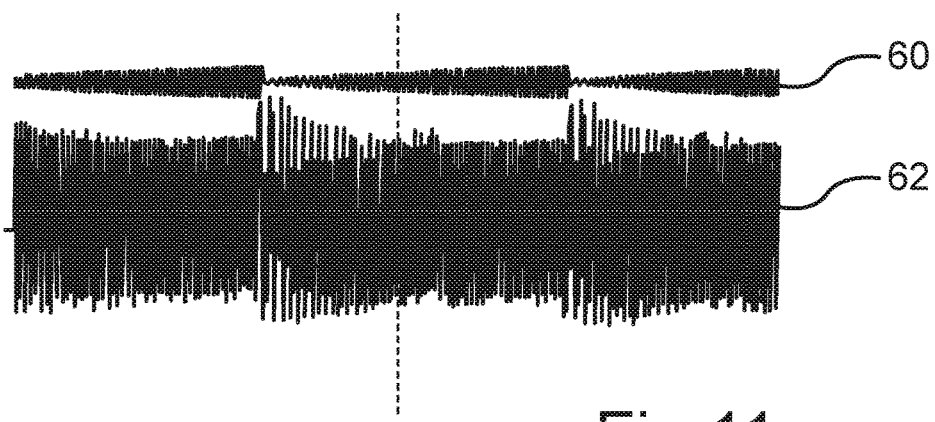
FIG. 11 is a schematic signal diagram of an output signal for an input signal according to FIG. 8.
Figure 12:
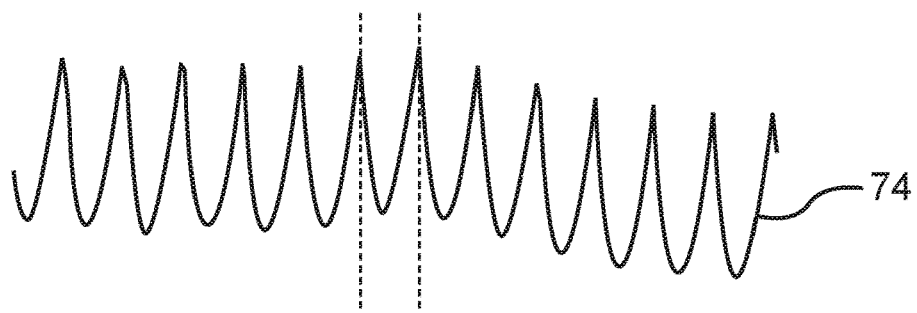
FIG. 12 is a schematic signal diagram of the output signal with an input signal according to FIG. 9.

Due to the clocked energy supply of the radar module 12, this results in a signal, which oscillates with 2.56 kHz and therefore is unusable. FIGS. 10 to 12 illustrate this.

FIG. 10 relates to a test input signal, which includes a frequency range from 1 kHz to 25 kHz, whereas FIG. 11 shows a corresponding representation as FIG. 10, but which includes a frequency range from 100 Hz to 1 kHz. The signal progressions of FIG. 10 can be associated with FIG. 7 and those of FIG. 11 with FIG. 9. FIG. 12 shows an oscillation of the output signal with a frequency of 2.56 kHz by means of a graph 74.

Figure 13:
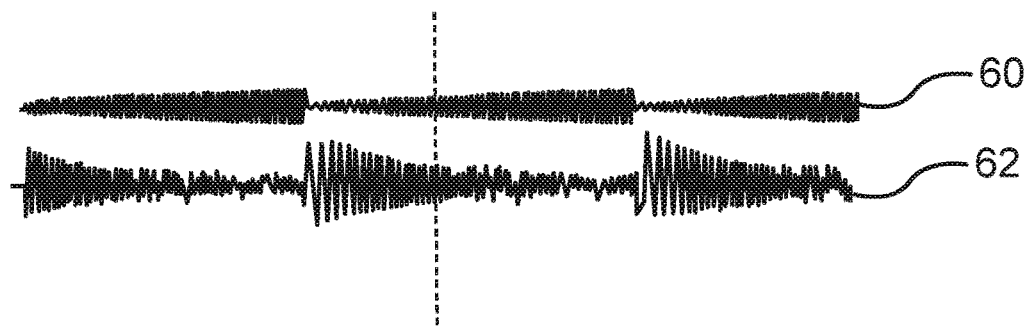
FIG. 13 is a schematic signal diagram like FIG. 11, wherein a low-pass function is additionally added according to the invention.
Figure 14:
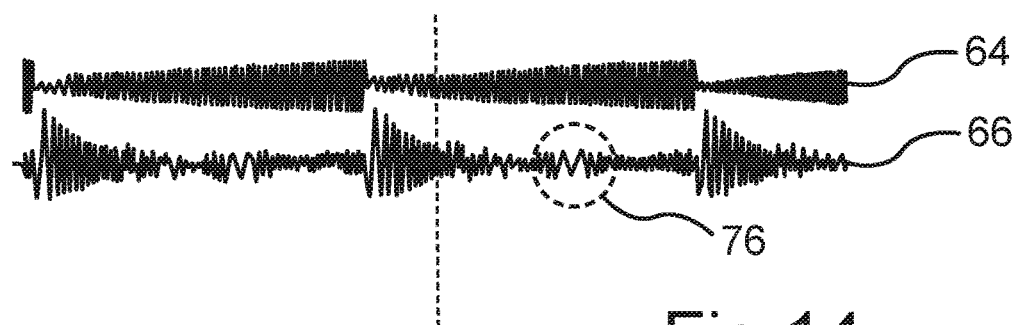
FIG. 14 is a representation like FIG. 13, wherein the frequency range is doubled with respect to the frequency range of FIG. 13.
Figure 15:
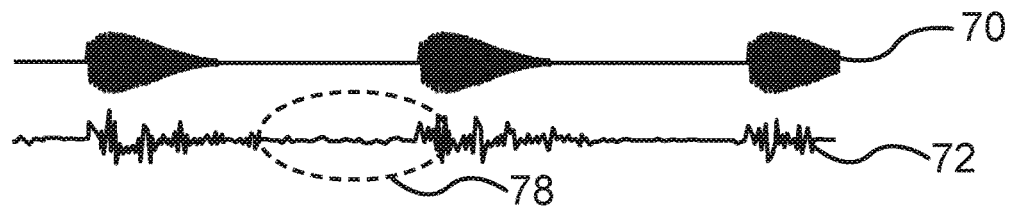
FIG. 15 is a representation of FIG. 10, wherein a low-pass function as in FIGS. 13 and 14 is realized here too.

However, if the circuit assembly 16 with the low-pass effect of the sample and hold circuit 30 is used, the above mentioned oscillation can be reduced or avoided and a low-pass effect at higher frequencies can be achieved. FIGS. 13 to 15 show corresponding representations. Therein, FIG. 13 can again be associated with FIG. 7 with respect to the frequency range, FIG. 14 with FIG. 8 with respect to the frequency range and FIG. 15 with FIG. 9 with respect to the frequency range. In particular, it is apparent from FIGS. 14 and 15 that the undesired disturbing effects can be reduced. This is illustrated by the sections 76, 78 in FIG. 14, 15.

The above mentioned embodiments only serve for explaining the invention and are not restrictive to it. In particular, method features can also be formulated for device features.

The invention claimed is:

1. A circuit assembly for time-discretizing an analog electrical signal comprising:
   an input terminal for supplying the analog electrical signal,
   an output terminal for providing a time-discrete signal depending on the supplied analog electrical signal, and
   a sample and hold circuit, which comprises:
      a capacitor connected to the output terminal,
      an electronic switching unit connected between the input terminal and the output terminal,
      a control unit for controlling the switching unit,
      wherein the switching unit is formed to provide an off-state due to an off-signal of the control unit and an on-state due to an on-signal of the control unit, and
      the switching unit is configured to provide an electrical resistance in the on-state, wherein the electrical resistance cooperates with the capacitor and comprises a preset resistance value such that the sample and hold circuit acts as a low-pass filter with a preset cut-off frequency, wherein the switching unit comprises a semiconductor switch having a switching path which provides the electrical resistance in the switched on state;
   a switchable electrical energy supply unit for supplying the circuit assembly with electrical energy;
   wherein the energy supply unit is formed to supply the circuit assembly with electrical energy in a clocked manner;
   wherein the electrical resistance and the capacitor of the sample and hold circuit of the circuit assembly are dimensioned such that a cut-off frequency determined hereby is less than a clock frequency due to clocking of the energy supply by the energy supply unit.

2. The circuit assembly according to claim 1, characterized in that the switching unit comprises a series connection of a switching element comprising the switching path with the electrical resistance.

3. The circuit assembly according to claim 2, characterized in that the electrical resistance is formed adjustable and connected to the control unit for adjusting a resistance value.

4. The circuit assembly according to claim 3, characterized in that the control unit is formed to keep the resistance value constant during a switched on state of the switching element.

5. The circuit assembly according to claim 2, characterized in that the switching element and the control unit are integrally formed.

6. The circuit assembly according to claim 2, characterized in that the electrical resistance and the switching element are integrated to a common component.

7. The circuit assembly according to claim 1, characterized by a correcting unit, which is connected to the output terminal and which is formed to determine an initial state of charge of the capacitor upon switching on the switching unit and an actual state of charge upon switching off the switching unit immediately following the switching on and to determine and output a set state of charge.

8. The circuit assembly according to claim 7, characterized in that the correction unit is formed to determine the set state of charge considering a time constant formed by the capacitor and the electrical resistance.

9. The circuit assembly according to claim 7, characterized in that the correction unit is encompassed by the control unit.

10. A detection device comprising:
a sensor unit, which provides an analog electrical sensor signal at a sensor terminal, and
a circuit assembly for time-discretizing the analog electrical sensor signal, for which purpose an input terminal of the circuit assembly is connected to the sensor terminal of the sensor unit and the circuit assembly is formed to provide a time-discrete sensor signal depending on the analog electrical sensor signal at an output terminal of the circuit assembly,
the circuit assembly for time-discretizing the analog electrical sensor signal comprises:
the input terminal for supplying the analog electrical sensor signal,
the output terminal for providing the time-discrete sensor signal depending on the supplied analog electrical sensor signal, and
a sample and hold circuit, which comprises:
a capacitor connected to the output terminal,
an electronic switching unit connected between the input terminal and the output terminal, and
a control unit for controlling the switching unit,
wherein the switching unit is formed to provide an off-state due to an off-signal of the control unit and an on-state due to an on-signal of the control unit,
the switching unit is configured to provide an electrical resistance in the on-state, wherein the electrical resistance cooperates with the capacitor and comprises a preset resistance value such that the sample and hold circuit acts as a low-pass filter with a preset cut-off frequency, wherein the switching unit comprises a semiconductor switch having a switching path which provides the electrical resistance in the switched on state;
a switchable electrical energy supply unit for supplying the detection device with electrical energy;
wherein the energy supply unit is formed to supply at least the sensor unit with electrical energy in a clocked manner;
wherein the electrical resistance and the capacitor of the sample and hold circuit of the circuit assembly are dimensioned such that a cut-off frequency determined hereby is less than a clock frequency due to clocking of the energy supply by the energy supply unit.

11. The detection device according to claim 10, characterized in that the sensor unit includes a radar sensor, an ultrasonic sensor and/or an infrared sensor.

12. The detection device according to claim 10, characterized in that the sensor terminal is connected to the input terminal via a DC block capacitor.

13. The detection device according to claim 10, characterized by an amplifier circuit connected to the output terminal for connecting to a lighting control of a lighting device.

14. A lighting device comprising:
an illuminant, and
a lighting control for controlling the illuminant, characterized by
a detection device connected to the lighting control, the detection device comprising:
a sensor unit, which provides an analog electrical sensor signal at a sensor terminal, and
a circuit assembly for time-discretizing the analog electrical sensor signal, for which purpose an input terminal of the circuit assembly is connected to the sensor terminal of the sensor unit and the circuit assembly is formed to provide a time-discrete sensor signal depending on the analog electrical sensor signal at an output terminal of the circuit assembly,
the circuit assembly for time-discretizing the analog electrical sensor signal comprises:
the input terminal for supplying the analog electrical sensor signal,
the output terminal for providing the time-discrete sensor signal depending on the supplied analog electrical sensor signal, and
a sample and hold circuit, which comprises:
a capacitor connected to the output terminal,
an electronic switching unit connected between the input terminal and the output terminal, and
a control unit for controlling the switching unit,
wherein the switching unit is configured to provide an off-state due to an off-signal of the control unit and an on-state due to an on-signal of the control unit,
the switching unit is configured to provide an electrical resistance in the on-state, wherein the electrical resistance cooperates with the capacitor and comprises a preset resistance value such that the sample and hold circuit acts as a low-pass filter with a preset cut-off frequency, wherein the switching unit comprises a semiconductor switch having a switching path which provides the electrical resistance in the switched on state;
a switchable electrical energy supply unit for supplying the detection device with electrical energy;
wherein the energy supply unit is formed to supply at least the sensor unit with electrical energy in a clocked manner;
wherein the electrical resistance and the capacitor of the sample and hold circuit of the circuit assembly are dimensioned such that a cut-off frequency determined hereby is less than a clock frequency due to clocking of the energy supply by the energy supply unit.

* * * * *